United States Patent
Philipsen

(10) Patent No.: US 10,914,008 B2
(45) Date of Patent: Feb. 9, 2021

(54) METHOD AND SOLUTION FOR FORMING INTERCONNECTS

(71) Applicant: IMEC VZW, Leuven (BE)

(72) Inventor: Henricus Philipsen, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/586,483

(22) Filed: Sep. 27, 2019

(65) Prior Publication Data
US 2020/0102655 A1   Apr. 2, 2020

(30) Foreign Application Priority Data
Sep. 27, 2018   (EP) ..................................... 18197361

(51) Int. Cl.
| | | |
|---|---|---|
| *C23C 18/44* | (2006.01) | |
| *H01L 23/532* | (2006.01) | |
| *H01L 21/768* | (2006.01) | |
| *C23C 18/54* | (2006.01) | |
| *H01L 21/288* | (2006.01) | |
| *H05K 3/18* | (2006.01) | |
| *H01L 21/285* | (2006.01) | |
| *H05K 3/46* | (2006.01) | |

(52) U.S. Cl.
CPC .............. *C23C 18/44* (2013.01); *C23C 18/54* (2013.01); *H01L 21/288* (2013.01); *H01L 21/28556* (2013.01); *H01L 21/76843* (2013.01); *H01L 21/76879* (2013.01); *H01L 23/53242* (2013.01); *H01L 23/53257* (2013.01); *H05K 3/181* (2013.01); *H05K 3/4661* (2013.01)

(58) Field of Classification Search
CPC ... C23C 18/44; C23C 18/54; H01L 23/53242; H01L 23/53247; H01L 21/76879; H01L 21/288; H01L 21/283; H01L 21/28556; H05K 3/181; H05K 3/4661
See application file for complete search history.

(56) References Cited

U.S. PATENT DOCUMENTS

| | | | | | |
|---|---|---|---|---|---|
| 1,394,164 | A * | 10/1921 | Gerrard | ..................... | F23D 5/00 431/213 |
| 4,427,502 | A * | 1/1984 | Abys | ...................... | C25D 3/567 205/242 |
| 5,242,551 | A * | 9/1993 | Frank | ................. | C08G 73/1089 204/157.81 |
| 6,074,945 | A * | 6/2000 | Vaartstra | ........... | H01L 21/28556 438/681 |
| 7,001,782 | B1 * | 2/2006 | Diana | ................... | H01L 21/288 257/295 |
| 7,049,234 | B2 * | 5/2006 | Cheng | ................. | C23C 18/1651 257/E21.174 |
| 7,229,922 | B2 * | 6/2007 | Dubin | ............... | H01L 21/76843 257/E21.591 |
| 7,279,423 | B2 * | 10/2007 | Johnston | ........... | H01L 21/28562 257/E21.171 |
| 7,476,618 | B2 * | 1/2009 | Kilpela | .................... | C23C 16/18 257/E21.171 |
| 7,614,145 | B2 * | 11/2009 | Wakizaka | .............. | H05K 3/389 174/259 |
| 7,977,235 | B2 * | 7/2011 | Ishizaka | .............. | H01L 21/7685 438/629 |
| 8,013,446 | B2 * | 9/2011 | Yang | .................. | H01L 23/53223 257/758 |
| 8,227,335 | B2 * | 7/2012 | Johnston | ........... | H01L 21/76843 438/622 |
| 2004/0164293 | A1 * | 8/2004 | Maloney | ............. | H01L 21/0332 257/40 |
| 2005/0142428 | A1 | 6/2005 | Daimon et al. | | |
| 2006/0063379 | A1 * | 3/2006 | Dory | .................. | H01L 21/76874 438/643 |
| 2007/0054487 | A1 * | 3/2007 | Ma | ..................... | H01L 21/76843 438/681 |
| 2007/0119370 | A1 * | 5/2007 | Ma | ..................... | C23C 16/45536 118/723 E |
| 2007/0190362 | A1 * | 8/2007 | Weidman | .......... | H01L 21/28562 428/701 |
| 2008/0194105 | A1 * | 8/2008 | Dominguez | ...... | H01L 21/76873 438/681 |
| 2009/0304914 | A1 * | 12/2009 | Nalla | ...................... | C23C 16/18 427/124 |
| 2010/0190111 | A1 * | 7/2010 | Ichiki | ...................... | H05K 3/22 430/311 |
| 2011/0057316 | A1 * | 3/2011 | Kim | .................. | H01L 23/53238 257/751 |
| 2014/0014507 | A1 | 1/2014 | Chung et al. | | |
| 2018/0222933 | A1 * | 8/2018 | Romero | ................ | C07F 11/005 |
| 2018/0340261 | A1 * | 11/2018 | Walter | .............. | H01L 23/53242 |
| 2019/0164817 | A1 * | 5/2019 | Khaderbad | ....... | H01L 21/82343 |

(Continued)

OTHER PUBLICATIONS

Hyland, Lee, "Electroless Deposition of Group Eight Metals", The University of Hull, Thesis submitted for the degree of Doctor of Philosophy, Oct. 1995, 172 pages.

Mandler, Daniel et al., "A New Approach to the High Resolution Electrodeposition of Metals via the Feedback Mode of the Scanning Electrochemical Microscope", J. Electrochem. Soc., vol. 137, No. 4, Apr. 1990, pp. 1079-1086.

(Continued)

*Primary Examiner* — David A Zarneke

(74) *Attorney, Agent, or Firm* — McDonnell Boehnen Hulbert & Berghoff LLP

(57) ABSTRACT

An oxygen-free or oxygen-poor solution for the electroless deposition of a platinum group metal is described. The solution includes a ruthenium (II) amine complex having a first oxidation potential, and a platinum group metal compound having a reduction potential larger than the opposite of the oxidation potential of the ruthenium (II) amine complex.

20 Claims, 6 Drawing Sheets

(56) References Cited

U.S. PATENT DOCUMENTS

2019/0309422 A1* 10/2019 Cooper ............ H01L 21/28556

OTHER PUBLICATIONS

Borrelli, David C. et al., "Preparation of Bi-Metallic Catalysts for Improved Fuel Cell Activity", The 2007 Annual Meeting, Nov. 5, 2007, 1 page.

* cited by examiner

METHOD AND SOLUTION FOR FORMING INTERCONNECTS

CROSS-REFERENCE TO RELATED APPLICATIONS

The present application is a non-provisional patent application claiming priority to EP 18197361.1, filed on Sep. 27, 2018, the contents of which are hereby incorporated by reference.

FIELD OF THE DISCLOSURE

The present disclosure relates to the field of platinum group metal interconnect formation and to solutions for forming the same.

BACKGROUND

Integrated circuits (ICs) are composed of devices and interconnects between these devices.

For optimal operation of the integrated circuits, both leakage and resistance at the level of the interconnects can be as small as possible.

Originally, aluminum was used to form the interconnects because it was easier to process than the less resistive copper. Since 1997, the so-called Damascene process enables the use of copper and the formation of multi-layer devices. Due to this technique, the industry has enabled a significant increase in integrated circuit complexity and an enormous decrease in feature size. New production techniques, like EUV lithography, make it possible to create features measuring only a few nm. However, Moore's law becomes significantly harder to maintain now that both current materials as well as lithography are reaching their limits.

The arising issues with copper are caused by both chemical and mechanical properties of the material, with some problems arising by the continuous scaling down of the interconnect layers. Copper has a very high diffusivity in silicon compared to other transition metals since it is relatively small and has only weak interactions with the silicon lattice, while having a strong interaction with silicon itself. Usually, copper ions migrate through diffusion, enhanced by the presence of electric fields. Barrier layers such as tantalum nitride or titanium nitride have been introduced to prevent copper migration. However, this barrier layer is not able to scale down as quickly as the interconnects do, leading to a larger fraction of each trench being occupied by the high resistivity barrier, increasing the effective resistivity of the whole interconnect. This can have a negative influence on the speed limit of signal propagation.

One solution to this problem is to replace copper by materials which would not need a barrier as copper does, increasing the space for the metal within each interconnect. Among these materials, platinum-group metals have shown to be good candidates due to their combination of a low bulk resistivity, high melting point, high chemical stability, catalytic activity and resistance to oxidation. Furthermore, ultra-thin platinum group metals show weaker resistivity thickness dependence than copper in the same thickness range. Also, these metals are up to 95% recoverable with recycling, giving these metals a relatively low negative environmental impact. The main problem with these materials however is their high initial cost. Even though extraction by mining has increased over time by an order of magnitude since 1960, extraction, concentration and refining of these metals still requires complex and energy-intensive processes, making them very expensive compared to other metals. Thus, if one wants to make use of the desirable properties of these materials in nano-electronics, the metal interconnects have to be formed without too much waste. The current Damascene process used for copper is not adequate for platinum group metals due to the large amount of waste it generates. To see where the problem lies with copper, one has to look at the current process.

In the current production process for micro/nano electronics, the Damascene process is often used and comprises the following steps. In the first step, a cavity is formed in a dielectric substrate. In the second step, the cavity is lined with a barrier layer. In the third step, a copper seed layer is provided in the cavity. In the fourth step, the cavity is completely filled with copper by electroplating (electrochemical deposition).

However, not only the trenches are filled using this method, but a layer is also formed on top of the substrate. This layer has to be etched or polished away until the dielectric is exposed. Most often, chemical mechanical polishing (CMP) is used for this, which removes the excessive metal using the mechanical input abrasive particles (e.g. silica or alumina), while hydrogen peroxide oxidizes the metal layer in a chemical attack. The Damascene process has the main advantage that it can obtain void-free filling using a higher deposition rate to achieve filling even at the bottom of cavity, as compared to alternative deposition techniques like PVD or CVD, which are not able to achieve this quality of filling. However, the amount of wasted material in the damascene process in the last CMP step makes it too costly to use when using more expensive materials than copper.

One candidate is electroless deposition (ELD). Electroless deposition requires the use of a reducing agent. Various reducing agents have been previously used in ELD. Examples thereof are borohydride and hypophosphite. However, these reducing agents have the tendency to incorporate B and P respectively in the deposited metal, which is not wished since this affects metal resistivity. Other reducing agents that have been used in ELD are formaldehyde, glyoxylic acid, and formic acid. However, such carbonyl-comprising reducing agents risk form carbonyl groups at the surface of the substrate to be coated by ELD. This leaves no room for the metal to be reduced to react on this surface. This phenomenon has been demonstrated for formic acid. Hydrazine is another reducing agent that has often been used. It is however notoriously toxic. Metal-based reducing agents have also been used. For instance, metal complexes having CN or CO ligands. CN and CO ligands are however dangerous to use in acidic conditions, which are often preferred to avoid oxidation of the deposited metal.

There is therefore a need for a method permitting the deposition of a platinum group metal. In particular, there is a need for a method permitting the safe forming of an interconnect without having to etch or polish half of it away, while still achieving a void-free filling not or less polluted by the reducing agent.

SUMMARY

It is an object of the present disclosure to provide systems and methods for forming a platinum group metal interconnect during the fabrication of an integrated circuit.

In a first aspect, the present disclosure relates to an oxygen-free or oxygen-poor solution for the electroless deposition of a platinum group metal, including: (a) a ruthenium (II) amine complex having an oxidation potential, and (b) a platinum group metal compound having a reduction potential larger than the opposite of the oxidation potential of the ruthenium (II) amine complex.

In a second aspect, the present disclosure relates to a method for forming a platinum group metal interconnect during the fabrication of an integrated circuit, including the steps of: (a) providing a substrate including: (i) a semiconductor substrate, (ii) a dielectric layer, the dielectric layer having a cavity therein for forming an interconnect, the cavity having a bottom, and (iii) a catalytic layer comprising a conductive material at least on the bottom of the cavity. The method includes exposing the catalytic layer to an oxygen-free or oxygen poor solution comprising a Ru (II) amine complex having a first oxidation potential, and a platinum group metal compound having a reduction potential larger than the opposite of the oxidation potential of the ruthenium (II) amine complex.

In a third aspect, the present disclosure relates to kit of part for the electroless deposition of a platinum group metal, including: (a) solution of a ruthenium (III) amine complex able to be reduced electrochemically to a ruthenium (II) amine complex having an oxidation potential, and (b) a solution of a platinum group metal compound having a reduction potential larger than the opposite of the oxidation potential of the ruthenium (II) amine complex (i.e. larger than the reduction potential of the ruthenium (III) amine complex).

In a fourth aspect, the present disclosure relates to kit of part for the electroless deposition of a platinum group metal, including: (a) a solution of a ruthenium (II) amine complex having an oxidation potential, and (b) a solution of a platinum group metal compound having a reduction potential larger than the opposite of the oxidation potential of the ruthenium (II) amine complex.

In a fifth aspect, the present disclosure relates to the use of a ruthenium (II) amine complex for the electroless deposition of a platinum group metal.

Particular and preferred aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1:
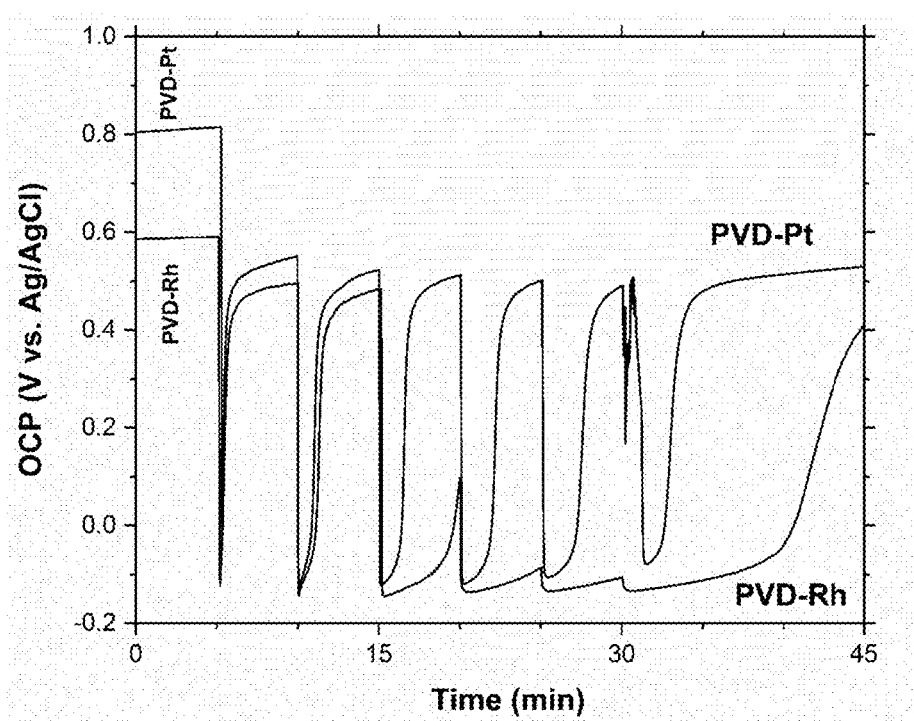
FIG. 1 is a chronopotentiometric graph comparing ELD on PVD-Pt and PVD-Rh according to an embodiment of the present disclosure.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more aspects of the disclosure. This method of disclosure, however, is not to be interpreted as reflecting an intention that the claimed disclosure requires more features than are expressly recited in each claim. Rather, as the following claims reflect, various aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein and unless provided otherwise, the term "reduction potential" (also known as "redox potential" and abbreviated $E°_{red}$) relates to the potential in volt with respect to the standard hydrogen electrode (SHE) at 25° C. and 1 atm at which a chemical species at an activity of 1M acquires one or more electrons and is thereby reduced.

Similarly, the term "oxidation potential" (abbreviated $E°_{ox}$) relates to the potential in volt with respect to the standard hydrogen electrode (SHE) at 25° C. and 1 atm at which a chemical species at an activity of 1M loses one or more electrons and is thereby oxidized.

For instance, the oxidation potential of Rh (in presence of 6 Cl$^-$) is −0.431 V and corresponds to the reaction Rh+6 Cl$^-$→[RhCl$_6$]$^{3-}$+3e− while the reduction potential of [RhCl$_6$]$^{3-}$ is +0.431 V and corresponds to the reaction [RhCl$_6$]$^{3-}$+3e−→Rh+6Cl$^-$.

As another example, the reduction potential of [Ru(NH$_3$)$_6$]$^{3+}$ is +0.10 V and corresponds to the reaction [Ru(NH$_3$)$_6$]$^{3+}$+e−→[Ru(NH$_3$)$_6$]$^{2+}$ while the oxidation potential of [Ru(NH$_3$)$_6$]$^{2+}$ is −0.10 V and corresponds to the reaction [Ru(NH$_3$)$_6$]$^{2+}$→[Ru(NH$_3$)$_6$]$^{3+}$+e−.

The knowledge of the reduction potential of the oxidant and of the oxidation potential of the reductant permits to determine whether the reaction between that oxidant and that reductant can be spontaneous. Indeed, the reaction can occur when the reduction potential $E°_{red}$ of the oxidant is larger than the opposite of the oxidation potential $E°_{ox}$ of the reductant, i.e. when $E°_{red} > -E°_{ox}$. Whether the reaction will actually be observed will depend on how favourable the kinetics will be.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

In a first aspect, the present disclosure relates to a solution for the electroless deposition of a platinum group metal. The solution is particularly suited for forming a platinum group metal interconnect during the fabrication of an integrated circuit. Such a method will be explained in more details in the second aspect of the present disclosure.

The solution is at least oxygen-poor and can be substantially oxygen-free. Within examples, the solution is oxygen-free. To be oxygen-poor, the solution typically underwent a treatment to remove oxygen present therein. Such treatments are well known to the person skilled in the art. For instance, nitrogen bubbling can be used and/or the method can be performed in the glovebox. In some embodiments, an oxygen scavenger may be present in the solution.

In some examples, the Ru (II) amine complex used to form the solution has been kept at or below room temperature, in a hermetically closed container, in a dry and inert atmosphere.

The solution used can be at another temperature than room temperature. The solution used can be at another pressure than standard atmospheric pressure (1013 hPa; 1 atm). The solution used has a salinity that is taken into account when measuring its oxygen concentration. The oxygen concentration of the solution is therefore measured at its actual temperature, pressure and salinity. Typically, the solution used is at room temperature (e.g. 25° C.) and at atmospheric pressure (e.g. 1013 hPa; 1 atm) and its oxygen concentration is measured at these temperature and pressure.

As used herein, the term "oxygen-poor" refers to an oxygen concentration below 4 mg/l. This represents less than half of the typical saturation value at room temperature and atmospheric pressure.

Within examples, the solution has an oxygen concentration below 1 mg/l, or possibly below 0.2 mg/l. 0.2 mg/l is a typical detection limit for an optical sensor.

By "substantially oxygen-free" or "oxygen-free", a concentration below 0.2 mg/l is meant.

Within examples, measurements of oxygen concentration are performed with an optical sensor because ions present in the solution can interfere to some degree with electrochemical sensors.

Oxygen concentration can be determined by following the international standard ISO 5814:2012(E).

Oxygen has a detrimental effect on the potency of the solution, its concentration is therefore can be relatively low. Without being bound by theory, it is believed that oxygen changes the oxidation number of Ru from (II) to (III).

The solution is typically an aqueous solution but organic solvents, miscible with water, can be present in the solution as well. Hence, the solvent present in the solution is either water or a mixture of water and water-miscible organic solvents. Examples of water miscible solvents are $C_{1-3}$ alcohols (methanol, ethanol, n-propanol, and isopropyl alcohol).

In embodiments, the solution may comprise one or more additives. Additives can assist in the deposition process and influence the structure filling performance. For instance, in a method for forming a platinum group metal interconnect during the fabrication of an integrated circuit, when a substrate is provided comprising a dielectric layer having a cavity, if a catalytic layer is present not only on the bottom of the cavity but also on the top surface of the dielectric layer, the platinum group metal could deposit both in the cavity and on the dielectric layer. Embodiments of the present disclosure in which the solution comprises one or more additives can at least partly solve that problem. In particular, a suppressor for preventing metal deposition on the top surface may be present in the solution according to the present disclosure. Typical examples of suppressors are polymers soluble in the solution. Polymers, due to their relatively high molecular mass, will more easily cover the top surface of the dielectric layer than the cavity. As a result of their presence on the top surface of the dielectric layer, such polymers decrease the likelihood of platinum group metal deposition on the top surface of the dielectric and hence increase the selectivity of the deposition toward the cavity. Typical examples of such polymers are polyalkylene glycols such as polyethylene glycol.

The solution comprises a ruthenium (II) amine complex (i.e. Ru(II) amine complex). In other words, it is obtainable from the dissolution of a ruthenium (II) amine complex therein.

The solution may comprise more than one Ru(II) amine complex.

By Ru(II) amine complex, it is meant a Ru(II) complex having at least one amine ligand complexed therewith wherein the nitrogen of the amine ligand is the donor atom. Ru(II) amine complexes are effective in the present disclosure in part due to their relatively high oxidation potential but also due to their low tendency to pollute the deposited metal, their low tendency to pollute the substrate on which the metal is to be deposited (typically a catalytic layer such as a seeding layer), and their relative low toxicity.

Within examples, the amine ligand is selected from $NH_3$ and primary amines. An example of suitable primary amine is ethylenediamine.

Within examples, the Ru(II) amine complex is a Ru(II) ammine complex, i.e. an Ru(II) amine complex comprising at least one $NH_3$ ligand.

Within examples, the Ru(II) amine (or aminne) complex has from one to six $NH_3$ ligands, or possibly from two to six $NH_3$ ligands, or possibly from three to six $NH_3$ ligands, or possibly from four to six $NH_3$ ligands, or possibly from five to six $NH_3$ ligands, and possibly six $NH_3$ ligands.

Within examples, a Ru(II) amine complex is $[Ru(NH_3)_6]^{2+}$. It can typically in the form of $[Ru(NH_3)_6]^{2+}Cl_2$. The amine complex $[Ru(NH_3)_6]^{2+}$ has an oxidation potential of −0.10 V vs standard hydrogen electrode at 25° C. and 1 atm. Since platinum group metal compounds typically have a reduction potential above +0.10 V, this oxidation potential of −0.10 V typically makes it potent to reduce platinum group metal compounds.

An example of a suitable Ru(II) amine complex having primary amine ligands is $[Ru(en)_3]^{2+}$ wherein "en" stands for ethylenediamine. This amine complex has an oxidation potential of −0.21 V vs standard hydrogen electrode at 25° C. and 1 atm. Since platinum group metal compounds typically have a reduction potential above +0.21 V, this oxidation potential of −0.21 V typically makes it potent to reduce platinum group metal compounds.

Within examples, the concentration of the ruthenium (II) amine complex (or of the ensemble of the ruthenium amine complexes counted together if more than one is present) in the solution may be from 2 mM to 40 mM, possibly from 3 mM to 5 mM.

The solution comprises a platinum group metal compound. In other words, it is obtainable from the dissolution of a platinum group metal compound therein.

The solution may comprise more than one platinum group metal compound.

The ruthenium (II) amine complex has an oxidation potential. The platinum group metal compound has a reduction potential larger than the opposite of the oxidation potential of the ruthenium (II) amine complex. By a reduction potential $E°_{red}$ larger than the opposite of the oxidation potential $E°_{ox}$, it is meant that $E°_{red} > -E°_{ox}$. The oxidation and reduction potentials are for instance measured versus standard hydrogen electrode at 25° C.

When more than one Ru(II) amine complex is present, at least one of the Ru(II) amine complexes has an oxidation potential larger than the opposite of the reduction potential of the platinum group metal compound.

When more than one platinum group metal compound is present, at least one of the platinum group metal compounds has a reduction potential larger than the opposite of the oxidation potential of the ruthenium (II) amine complex.

The platinum group metal compound can have the general formula $M^1X$ or $M^2M^1X$, wherein $M^1$ is one or more platinum group metal atoms totalizing a positive valency $v_1$, $M^2$ is one or more atoms, one or more functional groups, or a combination thereof, other than $M^1$, totalizing a positive valency $v_2$, and X is one or more atoms, one or more functional groups, or a combination thereof, totalizing a negative valency equal to $-(v_1+v_2)$.

As used herein the term "atom" is used to refer to a monoatomic chemical species (such as Cl) while the term "functional group" is used to refer to a polyatomic chemical species (such as a $NH_4$). Hence, when X is a plurality of atoms, it is a plurality of monoatomic chemical species (e.g. three Cl atoms or one Cl atom and one Br atom).

As used herein, the term positive valency when applied to an atom or a functional group relates to the number of chlorine atoms that must combine with that atom or functional group to form a neutral compound.

As used herein, the term negative valency when applied to an atom or a functional group relates to the number of hydrogen atoms that must combine with that atom or functional group to form a neutral compound.

For instance, for $RhCl_3$, $M^1$ is the Rh atom and it has a positive valency totalizing +3 while X represents the three Cl atoms and has a negative valency totalizing −3 (i.e. the sum of the −1 valency of each of the three Cl atoms equals −3).

As another example, in $(NH_4)_2Na[RhCl_6]$, $M^1$ is the Rh atom and it has a positive valency totalizing +3; $M^2$ represents the two $NH_4$ functional groups and the Na atom and it has a positive valency totalizing +3 (i.e. the sum of the +1 valency of each of the two $NH_4$ and of the Na); and X represents the six Cl atoms and has a negative valency totalizing −6 (i.e. the sum of the −1 valency of each of the six Cl equals −6).

The platinum group metal compound can also be in a hydrated form, in which case it can be represented by the general formula $M^1X.xH_2O$ or $M^2M^1X.xH_2O$ wherein x is an integer.

Within examples, $M^1$ is formed of a single element, i.e. a single type of atom, but the present disclosure is not limited thereto. The metal $M^1$ of the platinum group metal compound can typically be selected from Rh, Ir, Pd and Pt. Within examples, preferably it is selected from Rh and Ir. Within examples, Rh is selected.

In some embodiments, the solution is for depositing rhodium wherein the platinum group metal compound is a rhodium compound.

When X is a plurality of atoms, it can be a plurality of atoms of a same element (e.g. $Cl_3$ in $RhCl_3$) or of different elements (e.g. $BrCl_2$ in $RhBrCl_2$).

An example of X being a combination of one or more atoms and one or more functional groups is OH and $Cl_2$ in $[RhOH]Cl_2$ wherein one OH functional group and two Cl atoms are present.

In embodiments, X can be a halogen (such as Cl), $NO_2$, $NO_3$, OH, O or a combination thereof.

When $M^2$ is a plurality of atoms, it can be a plurality of atoms of a same element (e.g. Na in $Na_2[Pt(OH)_6]$) or it can be a plurality of atoms of different elements (e.g. Na and K in $KNa[Pt(OH)_6]$).

An example of $M^2$ being a combination of one or more atoms and one or more functional groups is $NH_4$ and Na in $(NH_4)_2Na[RhCl_6]$).

The solution is typically obtainable from the dissolution in a solvent of the platinum group metal compound(s) and of the ruthenium (II) amine complex(es). The chemical species actually present in the solution might differ from the general formula of the involved compounds due to, for instance, aquation. The person skilled in the art will however understand that by a solution comprising a platinum group metal compound and a ruthenium (II) amine complex, it is meant a solution in which a platinum group metal compound and a ruthenium (II) amine complex have been dissolved.

Examples of suitable platinum group metal compounds are $RhCl_3$, $RhCl_3.xH_2O$, $[RhOH]^{2+}X$, $M^2[RhCl_6]^{3-}$, $Rh(NO_3)_3$, $M^2[Rh(NO_2)_6]^{3-}$, $Rh(NH_3)_3(NO_2)_3$, $M^2[IrCl_6]^{3-}$, $M^2[PdCl_4]^{2-}$, $M^2[PtCl_4]^{2-}]$, $[PtOH]^+X$, $M^2[Pt(OH)_6]$, $M^2[Pt(NO_2)_4]^{2-}$, $Pt(NH_3)_2(NO_2)_2$ and $PtO_2$ amongst others. For instance, $M^2[RhCl_6]^{3-}$ may be $(NH_4)_2Na[RhCl_6]$, $M^2[Rh(NO_2)_6]^{3-}$ may be $(NH_4)_3[Rh(NO_2)_6]$, and $M^2[Pt(OH)_6]$ may be $Na_2[Pt(OH)_6]$. These examples of suitable platinum group metal compounds have in common that they have a reduction potential higher than the opposite of typical oxidation potentials of Ru(II) amine complexes and, in particular, higher than the opposite of the oxidation potential of $[Ru(NH_3)_6]^{2+}$ or $[Ru(en)_3]^{2+}$.

Two example platinum group metal compounds are $RhCl_3.H_2O$ and $(NH_4)_3[RhCl_6]$.

Within examples, the concentration of the platinum group metal compound (or of the ensemble of the platinum group metal compounds counted together if more than one is present) in the solution may be from 0.2 mM to 2 mM. Within examples, it is at least 0.3 mM.

The temperature of the solution is typically room temperature. For instance, it is from 15 to 30° C. The temperature can however be adjusted to slow down (lower temperatures) or speed up (higher temperatures) the deposition. A slower deposition can lead to a better quality of the deposited metal while a faster deposition can be more economical.

The solution of the present disclosure can have a neutral pH, an acidic pH or a basic pH. However, in particular examples an acidic pH is used. For instance, a pH from 0 to 5 can be used. The solution can for instance be acidified with an inorganic acid such as HCl, $H_2SO_4$, $HNO_3$, $H_3PO_4$, or a combination thereof. In embodiments, organic acids such as sulphonic acids (e.g. methane sulphonic acid) or carboxylic acids (e.g. citric acid) can also be used. Neutral salts forming acidic solution upon dissolution, such as e.g. $NH_4+Cl$, can also be used alone or in combination with an acid to acidify the solution. Without being bound by theory, the pH of the solution can impact the reduction potential of the platinum group metal compound. An acidic solution also has the advantage of avoiding oxidation of the deposited metal or precipitation of the platinum group metal as an oxide.

The solution can further comprise one or more complexing agents. Complexing agents can help tuning the reactivity of the solution. For instance, if the reactants tend to react already in the solution in absence of the catalytic surface on which the platinum group metal is to be deposited (typically a catalytic layer such as a seeding layer). The presence of complexing agents can help reducing the reactivity enough so that the reactants do not react only in solution anymore but react at least partly on the catalytic surface, and can mainly be on the catalytic surface, or possibly only on the catalytic surface. Such complexing agents are for instance citrate (e.g. sodium citrate), citric acid, EDTA, glycine, and ammonium hydroxide, amongst others. Within examples, EDTA, glycine and ammonium hydroxide are used as complexing agents. In some embodiments, the complexing agent can have the dual role of acting as a complexing agent and as a pH modifier.

In embodiments, the molar ratio complexing agent:platinum group metal compound may be from 1:1 to 10:1.

In embodiments, the molar ratio ruthenium (II) amine complex:platinum group metal compound may be from 5:1 to 20:1.

In embodiments of the first aspect, the solution may allow the deposition of a platinum group metal at a rate of from 0.5 to 2 nm per minute.

In a second aspect, the present disclosure relates to a method for forming a platinum group metal interconnect during the fabrication of an integrated circuit. This interconnect can for instance be a horizontal wire (e.g. a filled trench) connecting two horizontally separated elements of an integrated circuit. This interconnect can also be a vertical wire (e.g. a filled via) connecting two vertically separated elements of an integrated circuit. The method comprises steps a and b.

In step a, a substrate is provided. It is in that substrate that the platinum group metal interconnect will be formed.

The substrate comprises a semiconductor substrate. It can be any type of semiconductor substrate such as a group IV substrate or a group III-V substrate. The present disclosure works in presence of any type of semiconductor substrate.

The substrate further comprises a dielectric layer. The dielectric layer can be any type of dielectric layer. The present disclosure is compatible with any type of dielectric layer. It can be a $SiO_2$ layer, a high-k dielectric layer or a low-k dielectric layer. It is most typically a low-k dielectric layer.

The dielectric layer has a cavity therein for forming an interconnect.

The cavity is typically a via, a trench or a combination thereof. An example of combination is when a via is present at the bottom of a trench.

When the cavity is a via, the bottom of the cavity is typically made of a conductive layer and not the dielectric layer. The bottom of the via typically belongs to one of the lower of the two vertically displaced elements the via is meant to interconnect. Typical examples of materials that can form the bottom of the via are Ti, TiN and W. The present disclosure is can be performed on the front end of line (also called M0), i.e. when the bottom of the via is typically W. The present disclosure can also be used at higher levels of the formation of a integrated circuit. For instance, at level M1, M2 or even at higher levels.

In embodiments, the platinum group metal interconnect may be formed directly after the front-end-of-line (FEOL) of the fabrication of the integrated circuit.

In embodiments, the platinum group metal interconnect may be formed in the back-end-of-line (BEOL) of the fabrication of the integrated circuit.

By front-end-of-line, it is meant the portion of the fabrication of an integrated circuit where electronic devices (e.g. transistors, capacitors, resistors, diodes, etc. . . . ) are already formed, including conductive (metal or doped semiconductor) contacts thereto, but not including metal interconnects between these devices.

By back-end-of-line, it is meant the portion of the fabrication of an integrated circuit where conductive contacts present on electronic devices are interconnected.

The sidewalls of the via are typically made of the dielectric material but one or more layers may be lining the sidewalls, for instance to serve as a diffusion barrier. The need of such a diffusion barrier is however limited in the present disclosure.

When the cavity is a trench, the bottom of the trench is typically made of the dielectric layer (at least where no via is present). Of course, one or more intermediate layers can be present between the dielectric bottom of the trench and the catalytic layer. In that case, the bottom of the trench can be the top layer of these one or more intermediate layers. A typical intermediate layer would be a Ta/TaN barrier layer.

In embodiments, no diffusion barrier (such as Ta or TaN) is lining the sidewalls and/or the bottom of the cavity. The present disclosure does not require a diffusion barrier because the migration tendency of the platinum group metals is low.

Once filled with the platinum group metal, a via will typically connect electrically two vertically separated elements of an integrated circuit. Once filled with the platinum group metal, a trench will typically connect electrically two horizontally separated elements of an integrated circuit.

The present disclosure is particularly well suited for filling cavities of very small dimensions. For instance, the smaller lateral dimension (i.e. the width) of the cavity may be from 1 to 10 nm, from 1 to 7 nm, or from 1 to 5 nm.

In embodiments, the platinum group metal may be deposited with a thickness of from 1 to 40, or more particularly from 5 to 10 nm.

Since trenches are typically easier to fill than vias, when the cavity comprises both a trench and a via at the bottom of the trench, one way to proceed according to embodiments of the present disclosure is to first fill the via according to the present disclosure, then fill the trench according to a method other than electroless deposition (e.g. ALD, CVD or PVD). Since methods such as CVD can be faster than electroless deposition, this embodiment permits to combine the high quality filling of the hardest to fill part of the cavity (the via) and the high speed filling of the easiest to fill part of the cavity (the trench).

A catalytic layer is present at the least on the bottom of the cavity. In embodiments, the catalytic layer is lining the bottom and the sidewalls of the cavity. The catalytic layer comprises a conductive material. Within examples, the catalytic layer consists of a conductive material. Within other examples, the catalytic layer comprises or consists of a platinum group metal. The catalytic layer is typically a seeding layer consisting of a platinum group metal compound. The catalytic layer may also be a conductive material belonging to a contact of the FEOL or to an interconnect of the BEOL. In such a case, the catalytic layer may for instance be formed of Ti, TiN, or W which are conductive materials typically used to form contacts at the end of the FEOL. The catalytic layer may comprise more than one platinum group metal. Typically, the catalytic layer consists of one or more platinum group metals. More typically, the catalytic layer consists of a single platinum group metal.

The platinum group metal comprised in the catalytic layer may be selected from Pt, Pd, Ir and Rh. In some examples, Rh is selected.

The catalytic layer has catalytic properties and permits the formation of the platinum group metal, possibly thereon rather than in the solution.

In embodiments, step a of providing the substrate may comprise:
  ai. Providing the semiconductor substrate,
  aii. Providing the dielectric layer above the semiconductor substrate, the dielectric layer comprising a cavity, and
  aiii. Depositing the catalytic layer (e.g. a rhodium seeding layer) at least on the bottom of the cavity.

In embodiments, to activate the catalytic layer to facilitate the electroless deposition/enhance the activity of the catalytic layer, a pre-treatment can be performed, such as the reduction or the removal by wet-chemical dissolution of native surface oxide, e.g. in a high-temperature process step in a gas atmosphere capable of reducing the oxide or by adding a compound to the ELD solution which dissolves the oxide.

Depositing the catalytic layer can be done by physical vapor deposition (PVD), atomic layer deposition (ALD), or chemical vapor deposition (CVD).

PVD is suitable. ALD and CVD have the advantages of providing better coverage than PVD, especially when the width of the cavity is below 10 nm.

ALD and CVD also have the advantage of selectivity and can be more easily used to deposit the catalytic layer only at the bottom of the cavity instead of at the bottom and on the sidewalls.

The thickness of the catalytic layer may for instance be from 1 to 20 nm but can be from 1 to 5 nm. The catalytic layer can be a closed layer. The catalytic layer can be a monolayer, i.e. a layer of atomic thickness.

In step b, the catalytic layer is exposed to an oxygen-free or oxygen-poor solution comprising a Ru (II) amine complex having an oxidation potential, and a platinum group metal compound having a reduction potential larger than the opposite of the oxidation potential of the ruthenium (II) amine complex.

The exposition is typically performed by dipping the substrate comprising the catalytic layer in a bath comprising the solution. However, any other method of exposure may be used.

The solution may be as described in the first aspect.

In embodiments, step b may be performed by:
(b1) immersing the substrate having the catalytic layer in a solution comprising the platinum group metal compound, and
(b2) gradually adding the Ru (II) amine complex from a solution.

The solution comprising the platinum group metal compound and the solution comprising the Ru (II) amine compound may be such that if they were mixed together at once, they would form a solution as described in the first aspect. In particular, the solution comprising the platinum group metal compound and/or the solution comprising the Ru (II) amine complex may have an oxygen content, a temperature, a solvent composition, a composition in platinum group metal compound and/or Ru (II) amine complex respectively, a pH, and a content in complexing agent as described for the solution of the first aspect.

The end result is a substrate which catalytic layer is exposed to a solution according to the first aspect. The advantage of proceeding that way is that a lower degree of homogeneous reaction takes place. In other words, more platinum group metal deposits on the catalytic layer and less forms in the solution itself. This embodiment has the further advantage of a better stability, and in particular a longer shelf-life, of the two used solutions. Indeed, instead of storing a solution according to the first aspect, with the risk of having the solution reacting even in absence of a catalytic layer, the Ru(II) amine solution and the platinum metal group solution can here be stored separately until their use.

In embodiments, the oxygen-free or oxygen poor solution used in step b may be obtained by a method comprising a step of generating electrochemically the Ru(II) amine complex by reduction from a Ru(III) amine complex. For instance, in a first step, a Ru(III) amine complex in solution (e.g. in presence of HCl of NH$_4$Cl) may be treated in order to make it oxygen-poor or oxygen-free. In a second step, that solution may be reduced electrochemically to a Ru(II) amine complex solution. This electrochemically generated Ru(II) amine complex solution can then be mixed with a platinum group metal in solution (e.g. in presence of HCl or NH$_3$Cl) to form the oxygen-free or oxygen poor solution comprising a Ru (II) amine complex having an oxidation potential, and a platinum group metal compound having a reduction potential larger than the opposite of the oxidation potential of the Ru (II) amine complex.

In embodiments, the step b may be performed by:
b1. Immersing the substrate having the catalytic layer in a solution comprising the platinum group metal compound, and
b2. gradually adding the Ru (II) amine complex from an electrochemically generated solution as described above.

This embodiment starts by immersing the substrate having the catalytic layer in a solution comprising only the platinum group metal compound, and not the Ru (II) amine complex. This embodiment has the advantage of a better stability, and in particular a longer shelf-life, of the two used solutions. Indeed, instead of storing a solution according to the first aspect, with the risk of having the solution reacting even in absence of a catalytic layer, the Ru(III) amine solution (or the Ru(II) amine solution) and the platinum metal group solution can here be stored separately until their use. The use referred herein when the Ru(III) is concerned is its electrochemical reduction to Ru(II). The use referred herein when the Ru(II) is concerned is its addition to the solution comprising the platinum group metal compound.

In embodiments of the second aspect, the method may allow the deposition of a platinum group metal at a rate of from 0.5 to 2 nm per minute.

Any feature of the second aspect of the present disclosure may as correspondingly described for the first aspect of the present disclosure.

In a third aspect, the present disclosure relates to kit of part for the electroless deposition of a platinum group metal, comprising:
a. A solution of a ruthenium (III) amine complex able to be reduced electrochemically to a ruthenium (II) amine complex having an oxidation potential, and
b. A solution of a platinum group metal compound having a reduction potential larger than the opposite of the oxidation potential of the ruthenium (II) amine complex (i.e. larger than the reduction potential of the ruthenium (III) amine complex).

Any feature of the third aspect of the present disclosure may be as correspondingly described for the first aspect of the present disclosure.

In particular, the solution comprising the platinum group metal compound and the solution comprising the Ru (III) amine complex may have an oxygen content, a temperature, a solvent composition, a composition in platinum group metal compound or Ru amine complex respectively, a pH, and a content in complexing agent as described for the solution of the first aspect.

This implies that the concentration of the ruthenium (III) amine complex of the solution of the third aspect may be as described for the concentration of the ruthenium (II) amine of the solution of the first aspect. Also, concerning the nature of the ruthenium (III) amine complex, this complex may correspond to an oxidized form of any ruthenium (II) amine complex described in the first aspect.

In a fourth aspect, the present disclosure relates to kit of part for the electroless deposition of a platinum group metal, comprising:
a. A solution of a ruthenium (II) amine complex having an oxidation potential, and
b. A solution of a platinum group metal compound having a reduction potential larger than the opposite of the oxidation potential of the ruthenium (II) amine complex.

Any feature of the fourth aspect of the present disclosure may be as correspondingly described for the first aspect of the present disclosure.

In particular, the solution comprising the platinum group metal compound and the solution comprising the Ru (II) amine complex may have an oxygen content, a temperature, a solvent composition, a composition in platinum group metal compound or Ru amine complex respectively, a pH, and a content in complexing agent as described for the solution of the first aspect.

In a fifth aspect, the present disclosure relates to the use of a ruthenium (II) amine complex for the electroless deposition of a platinum group metal.

In embodiments, the use is for forming a platinum group metal interconnect during the fabrication of an integrated circuit.

In embodiments, the platinum group metal may be deposited with a thickness of from 1 to 40, possibly from 5 to 10 nm.

In embodiments of the first aspect, the use may allow the deposition of a platinum group metal at a rate of from 0.5 to 2 nm per minute.

Any feature of the fifth aspect, and in particular the ruthenium (II) amine complex, the solution in which it may be present, the deposition method and the platinum group metal may be as described in the first and second aspect of the present disclosure may be as correspondingly described in the first and second aspect.

Example 1: Forming of a PVD-Pt Substrate

A PVD-Pt substrate, serving as a model of a Pt seeding layer at the bottom of a cavity of an integrated circuit, was formed as follows:

A PVD-Pt wafer was cut into a rectangle of approximately 1.5 cm by 1.5 cm using a diamond-tipped pen. The PVD-Pt wafer consists of a silicon wafer with a thickness of 750 μm with a Ti layer on top with a thickness of 30 nm, with the top layer being 25 nm PVD-Pt. After cutting the wafer, it is cleaned in a piranha solution for 5 minutes, made from 1 part $H_2O_2$ (30%) followed by 3 parts $H_2SO_4$ (96%). Afterwards, it is rinsed off using ultra-pure water (UPW) and blown dry using $N_2$. It is then placed in a rotating disc electrode (RDE) holder with the Pt side down.

Example 2: ELD of Rh on the PVD-Pt Substrate of Example 1

A piece of piranha-cleaned PVD-Pt was submerged in a 0.5 mM $RhCl_6$ solution under an angle outside of the RDE. A 5 mM ruthenium (II) hexamine complex was then added gradually directly onto the substrate. Mixing was performed by a stirring rod. After 6 depositions, a deposited Rh layer was seen on this substrate, proven it is possible to deposit the Rh without an external power source.

Example 3: Forming of a PVD-Rh Substrate

The PVD-Rh has a 10 nm rhodium layer deposited by PVD on top of the PVD-Pt layer of example 1. After cutting the wafer, it is cleaned in a piranha solution for 5 minutes, made from 1 part $H_2O_2$ (30%) followed by 3 parts $H_2SO_4$ (96%). Afterwards, it is rinsed off using ultra-pure water (UPW) and blown dry using $N_2$. It is then placed in the RDE holder with the Pt/Rh side down.

Example 4: ELD of Rh on the PVD-Rh Substrate of Example 3

Example 2 was repeated with this new substrate. After 6 depositions, a deposited Rh layer was seen on this substrate.

Example 5: Chronopotentiometric Study of the ELD of Rh on Either PVD-Pt or PVD-Rh Chronopotentiometry was used to check the open-circuit potential (OCP) over time during an ELD measurement at zero applied current. For this measurement, the ELD solution was prepared by first degassing 160 mL of a 0.18M $H_2SO_4$ solution with nitrogen for 1 hour to make sure the solution is as free of oxygen as possible. This solution was then split into two portions, equaling 60 and 100 mL. In the largest portions, the desired amount of the complex to be reduced was added. To the other, the desired amount of the ruthenium hexamine (II) complex was added. These concentrations were chosen in such a way that after mixing both solutions completely, they match the particular Rh:Ru molar ratio desired for that particular experiment. In the present case, a molar ratio Rh:Ru of 1:10 was selected. Typically, this equals 5 mM for the ruthenium complex and 0.5 mM of the Rh complex. The RDE was then placed with the PVD-Pt/Rh substrate into the solution with the metal complex to be reduced and degassed for another 30 minutes. The ruthenium complex was also still degassed. The chrono-measurement was then started. After 5 minutes, either all of the ruthenium solution of just 10 mL of total volume was added. For step-wise addition, 10 mL of the ruthenium complex solution was added each 5 minutes until the solution was entirely added. After the open circuit potential (OCP) had stabilized after the final addition, the measurement was paused and the substrate rinsed with ultra-pure water and then blown dry using nitrogen.

We now refer to FIG. 1. After each addition, the OCP of the initial solution decreased towards negative values, permitting the deposition of the Rh on the PVD-Pt. It is interesting to see that the time it takes for the potential to recover to a potential above 0.4V increases with each addition, indicating a longer stability with increasing ruthenium concentration of the solution. The anomaly with the sixth addition on PVD-Pt is explained by a gas bubble which was trapped under the RDE which was removed by removing the RDE from the solution during the measurement and placing it in the solution again. Otherwise, a peak similar to the one after the fifth addition was expected but with a longer recovery time.

The initial OCP values for the PVD-Pt (0.82V) and PVD-Rh (0.59V) electrodes exposed to solution are different. After electroless deposition of Rh on the PVD-Pt substrate, the OCP reached after 45 min is close to that of a PVD-Rh electrode, which indicates metal has been deposited.

For PVD-Rh, an immediate drop to negative potentials is also observed. When looking at the successive additions, the PVD-Rh shows better potentials (staying negative longer) than the PVD-Pt. In particular, it only reaches 0.1V after five minutes and not even reaching positive potentials after four additions, showing a recovery time of over 1000 seconds after six additions. This means that with the PVD-Rh there is a larger window in which the rhodium can deposit on the substrate.

Example 6: ELD of Rh on Either PVD-Pt Using Different Ratio Rh:Ru

Figure 2:
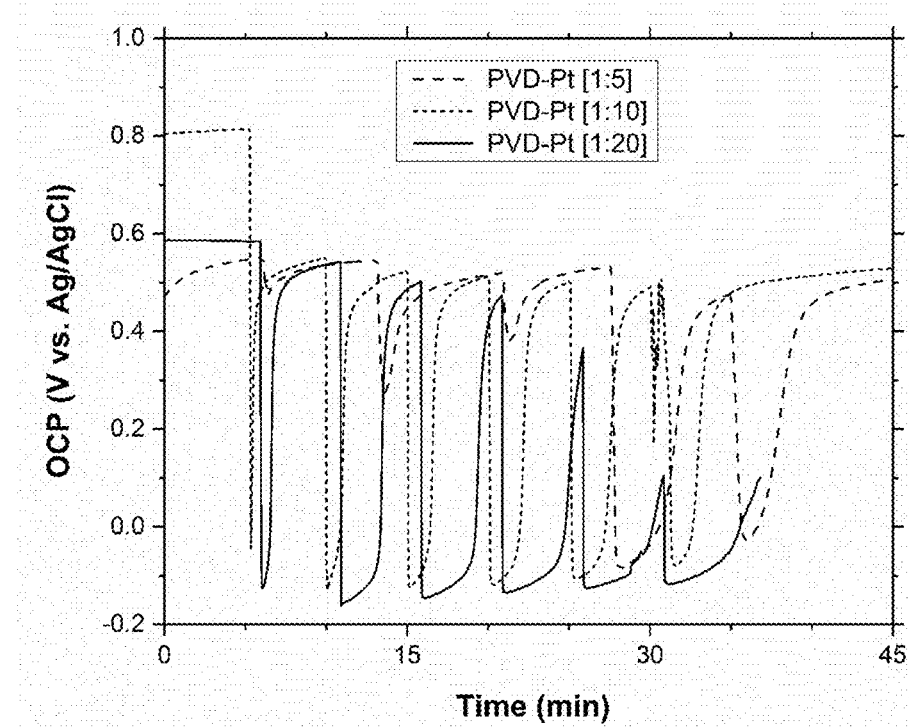
FIG. 2 is a chronopotentiometric graph comparing ELD on PVD-Pt with different ratio Rh:Ru according to an embodiment of the present disclosure.

As it was seen that a smaller ratio of Rh:Ru ratio leads to a longer recovery time, leading to a longer deposition time, an even smaller ratio was experimented with. FIG. 2 shows that decreasing the ratio to 1:20 leads to an even further increase of recovery time after each addition, with now the trend of decreasing potentials before adding the ruthenium solution also reaching values around 0V for the PVD-Pt.

Example 7: ELD of Rh on PVD-Rh Using Lower Concentrations of Rh and Ru

Figure 3:
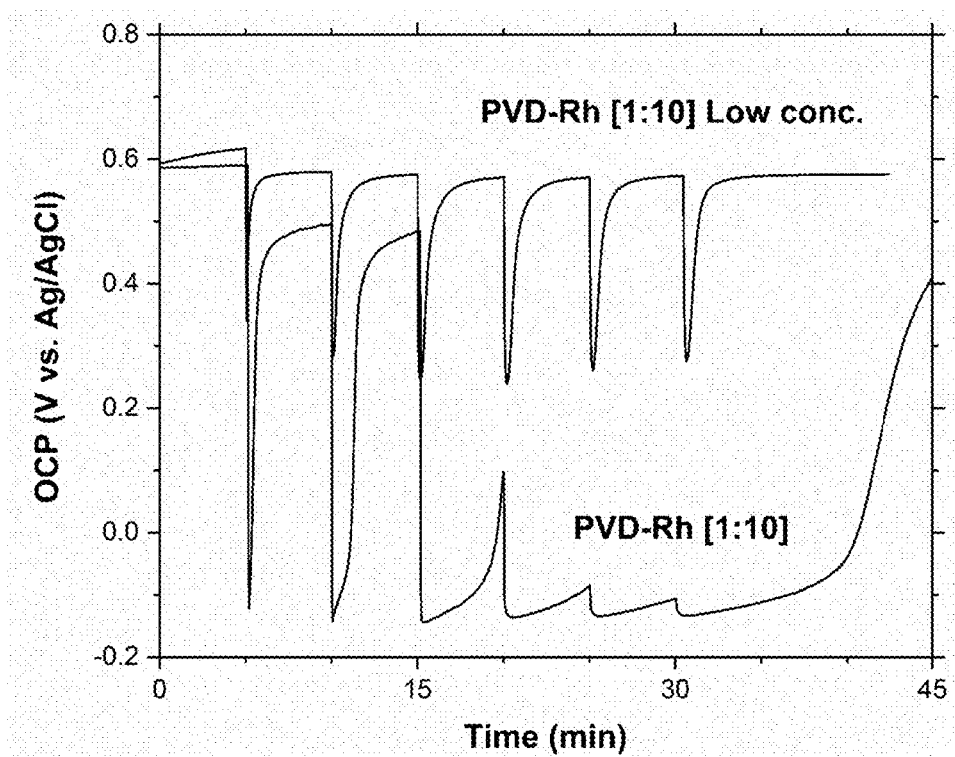
FIG. 3 is a chronopotentiometric graph comparing ELD on PVD-Rh of different concentrations of the Rh and the Ru compounds according to an embodiment of the present disclosure.

As was shown that a Rh:Ru ratio of 1:10 was successful for ELD at concentrations of 0.5 mM of the rhodium complex and 5 mM of the ruthenium complex, it was checked whether a concentration five times as small would also be successful. The deposition was carried out on a PVD-Rh sample to optimize the conditions for deposition. The rest of the procedure stayed the same. The graph in FIG. 3 shows that the lower concentration fails to reach negative potentials, even after six additions of the ruthenium solution. Deposition of Rh is not confirmed.

From these experiments, it can be concluded that electroless deposition has succeeded. Using $Ru(NH_3)_6^{2+}$ as the reducing complex and $RhCl_6$ as the complex which is reduced to its metallic state, rhodium was deposited on a PVD-Pt and PVD-Rh substrate within a rotating disc electrode in a degassed 0.18M sulphuric acid solution. It was shown that using a higher ratio of ruthenium to rhodium led to an increase in stability at negative potentials, making the metal able to deposit at the substrate for a longer time since negative potentials are preferable for deposition of rhodium. The increase in potential after each addition of the ruthenium complex is expected to be the result of either non-noble behavior of the PVD-Rh and PVD-Pt substrates, as well as possible presence of oxygen within the solution. To overcome this reoxidation, an increase in ratio of Rh:Ru seemed to increase the recovery time. An amount of rhodium of 0.05M was not sufficient for ELD to succeed.

Example 8: Effect of pH on the Reduction Potential of the Rh Compound

Figure 4:
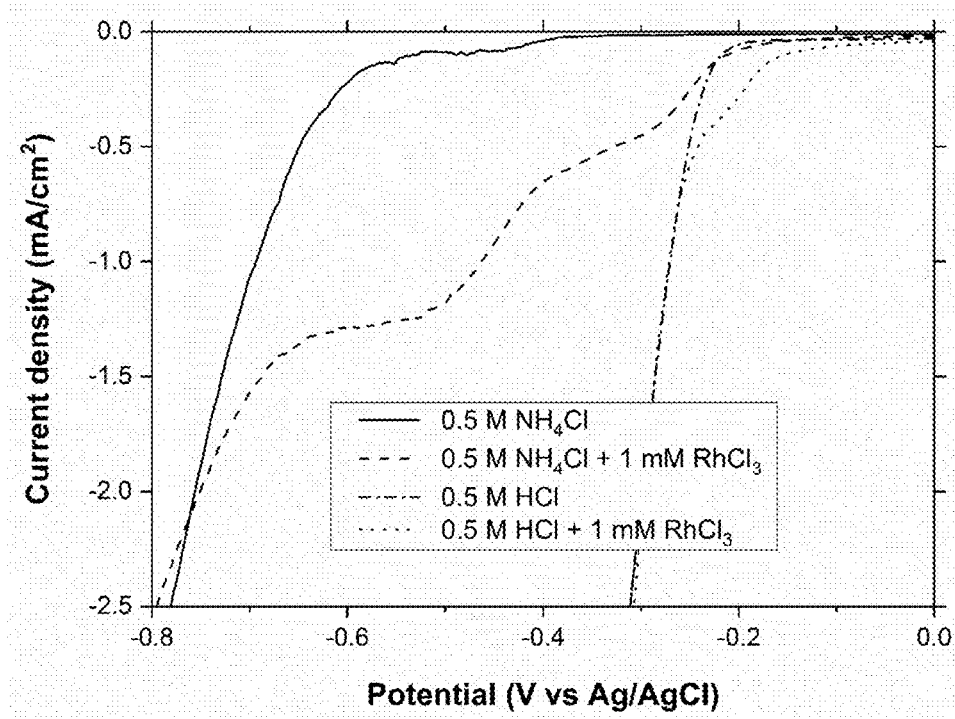
FIG. 4 shows cathodic voltammograms for 0.5 M $NH_4Cl$ and HCl in the presence and absence of 1 mM $RhCl_3$ according to an embodiment of the present disclosure.

As can be seen in FIG. 4, the solution pH (0.5 M HCl or 0.5 M $NH_4Cl$) has an impact on the potential at which Rh is electrodeposited on the Pt substrate, decreasing the pH leads to more positive (less negative) reduction potentials.

Example 9: Effect of Oxygen on the $Ru(NH)_6Cl_2$

Figure 5:
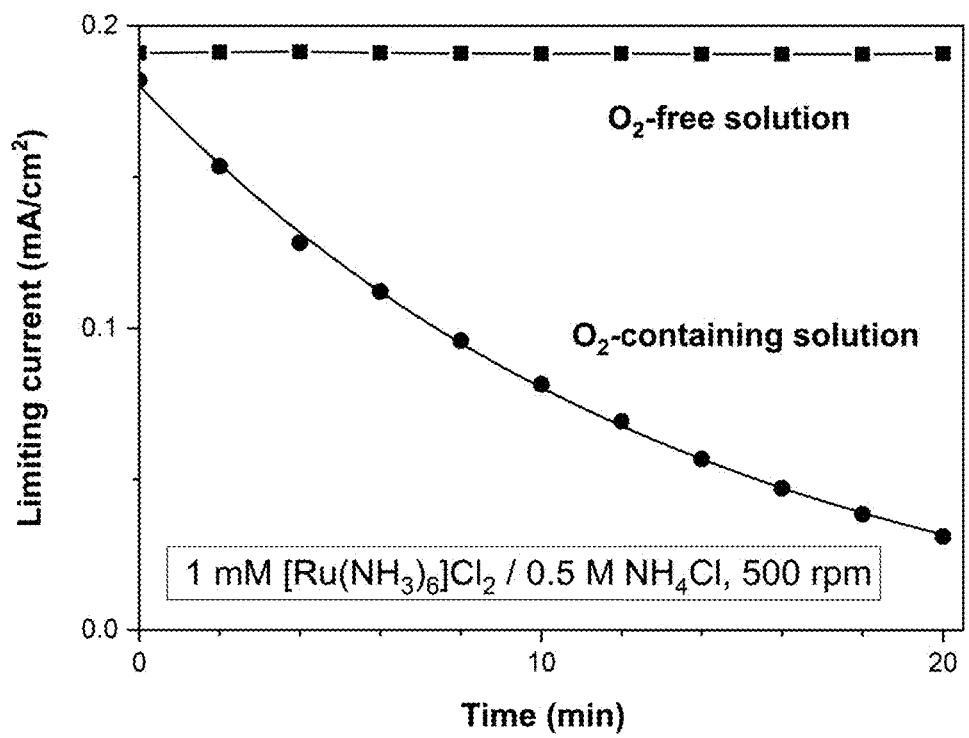
FIG. 5 shows the impact of dissolved oxygen on the anodic limiting current of a reducing agent, which is a measure for its concentration according to an embodiment of the present disclosure.

FIG. 5 shows the effect over time of removing any oxygen shielding over formally degassed 1 mM $Ru(NH_3)_6Cl_2$/0.5M $NH_4Cl$ solution.

Example 10: ELD of Rh on Substrates that have been Pre-Coated by Electrodeposition (ECD) with Rh First a 0.5 M $NH_4Cl$ electrolyte solution was prepared and degassed with $N_2$ for 20-25 minutes. The resulting solution was then covered with parafilm.

ELD-Rh was obtained starting from a Pt substrate on top of which a 14 nm ECD-Rh pre-coating was present. This pre-coating helps the homogeneous Rh nucleation.

The substrate was taped to a flat rotating disk electrode (RDE), immersed in the electrolyte solution and rotated at 100 rpm.

Once the oxygen was eliminated as much as possible, the reducing agent $[Ru(NH_3)_6]Cl_2$ was added so as to obtain a 0.001 M solution thereof. The Rh precursor $RhCl_3.H_2O$ was then added in 4 additions, spaced by 7 minutes, so as to obtain a 0.001 M solution thereof. After the fourth addition, the solution was dark black.

The total deposition time was approximately half an hour.

Both a homogeneous reaction and a heterogeneous reaction was observed.

The obtained ELD+ECD-Rh sample was then cleaved in two parts. One of the two parts was then annealed at 420° C. for 20 minutes. Then, the non-annealed ELD+ECD-Rh sample and the annealed ELD+ECD-Rh sample were subjected to TEM analysis.

Figure 8:
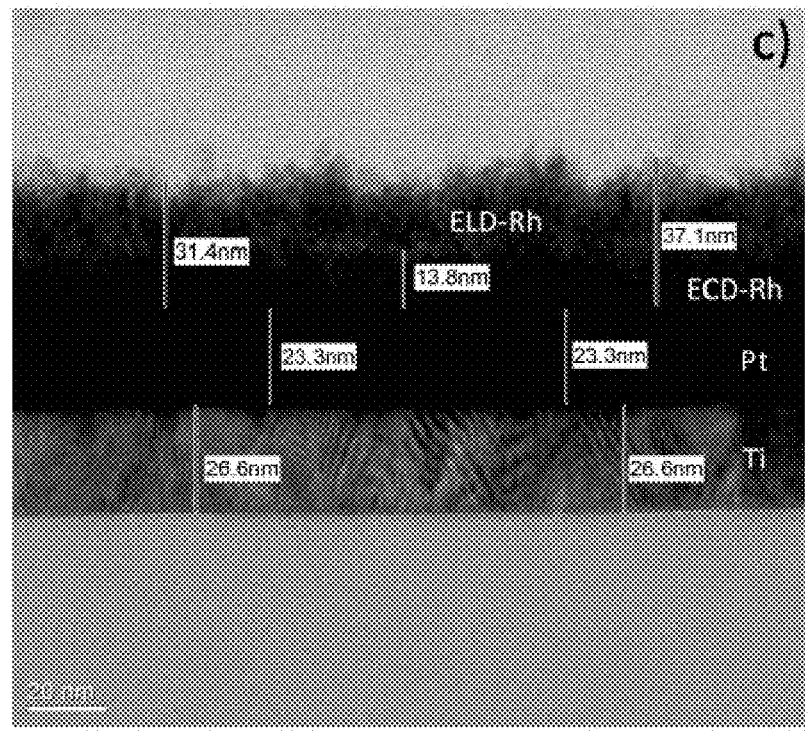
FIG. 8 is another TEM image of the sample of FIG. 6, before annealing, where the layer thicknesses are indicated according to an embodiment of the present disclosure.

FIG. 8 corresponds to the non-annealed sample and shows different layers. First, a 30 nm PVD-Ti layer and 25 nm PVD-Pt layer can be seen on the substrate. On top of that, a ~37 nm ECD+ELD-Rh layer is visible.

Figure 7:
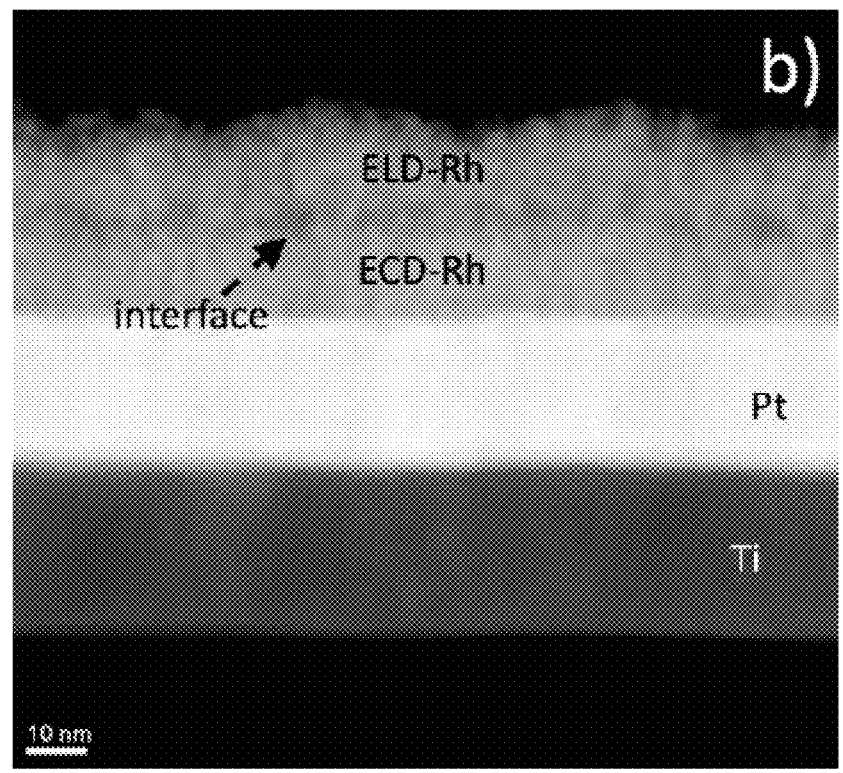
FIG. 7 is a High-angle Annular Dark-Field Scanning Transmission Electron Microscopy (HAAFDT-STEM) image of the layer of FIG. 6 according to an embodiment of the present disclosure.

Specifically, the thickness of ECD-Rh is about 14 nm and the ELD-Rh is about 23 nm thick. The ECD-Rh layer appears to be deposited (and not just adsorbed), because the Pt—Rh interface is compact and uniform. FIG. 7 is a HAADF-STEM image whose contrast is proportional to the thickness of the TEM specimen, to the density and to $\sim<Z>^2$ where Z is the atomic number.

Figure 6:
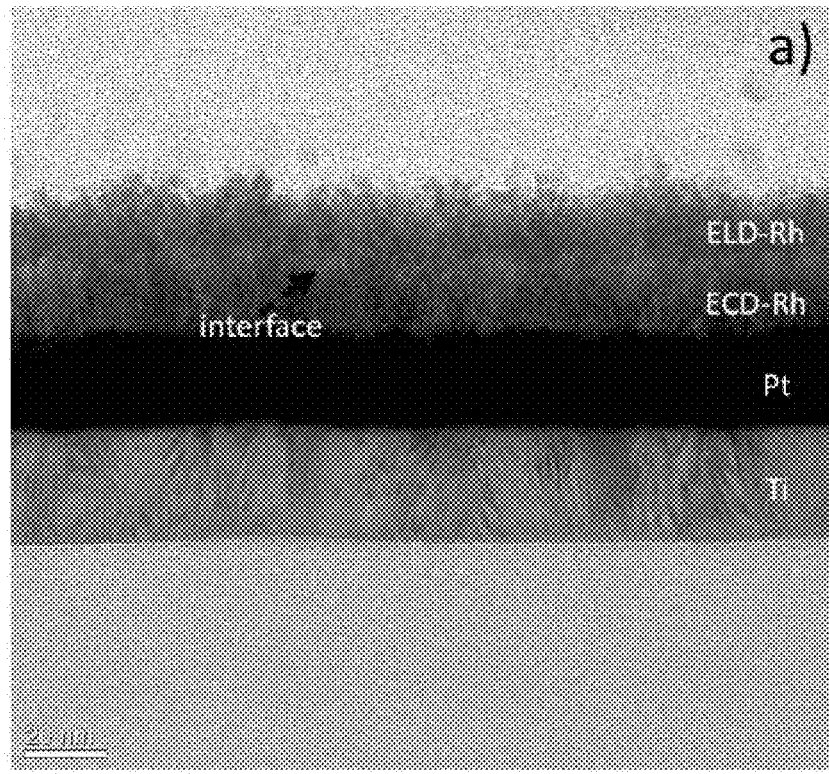
FIG. 6 is a transmission electron microscope (TEM) image of a platinum group metal layer formed on an electrodeposited Rh seed layer from a solution according to an embodiment of the first aspect.
Figure 9:
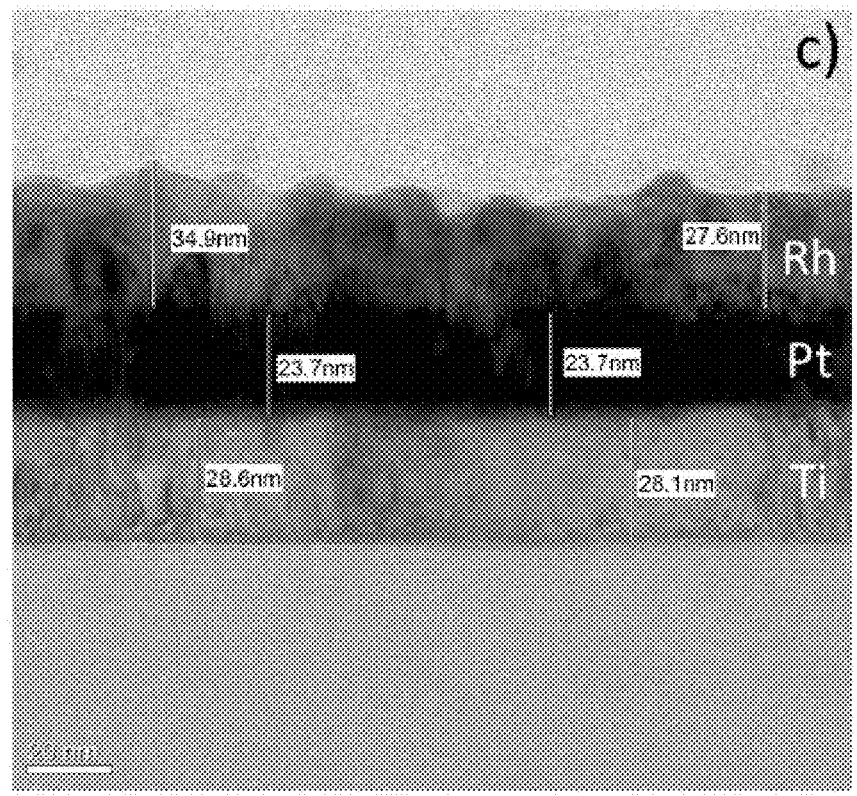
FIG. 9 is a TEM image of the sample of FIG. 8 after annealing according to an embodiment of the present disclosure.

Despite being of the same material, the interface between the ECD and the ELD layer is clearly visible as a lower density, region (FIG. 7). The interface is also discernible from FIG. 6. The ELD-Rh top layer shows a very fine, non-dense columnar growth, with crystallite size of 2-3 nm. Upon annealing, the ELD-Rh and the ECD-Rh interface disappears, forming a Rh layer of about 35 nm. A shrinkage of 2 nm resulted from a crystallization due to the annealing (FIG. 9).

Figure 10:
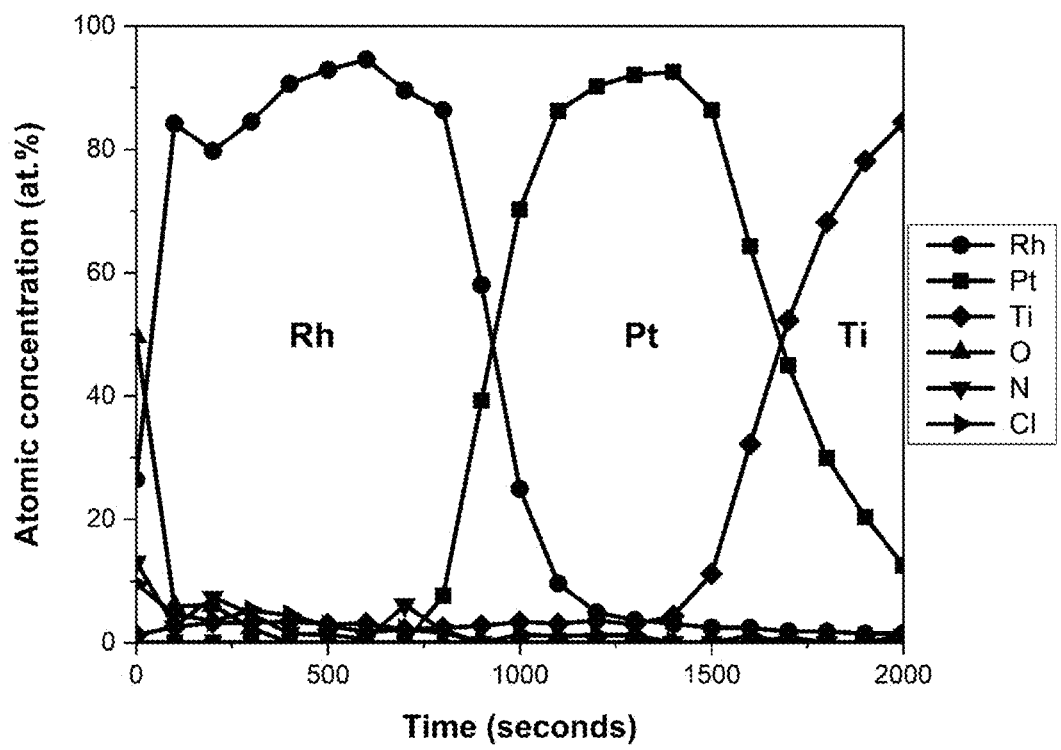
FIG. 10 is an XPS-depth profile of an ELD layer of Rh on substrates that have been pre-coated by electrodeposition (ECD) with Rh according to an embodiment of the present disclosure.
Figure 11:
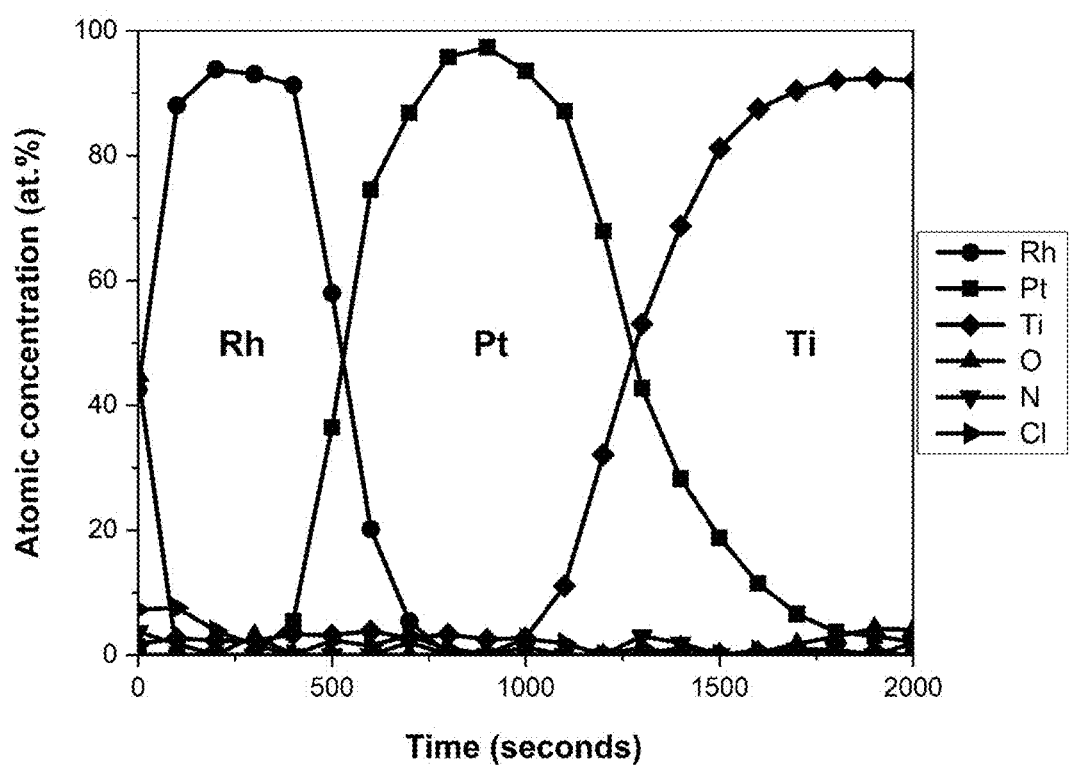
FIG. 11 is an XPS-depth profile of the pre-coated Rh-ECD substrate according to an embodiment of the present disclosure.

RBS results (not shown) indicate that the ELD+ECD-Rh sample is indeed thicker than the ECD-Rh sample. This is also confirmed by the XPS analysis. FIG. 10 and FIG. 11 show the XPS depth profile of an ELD+ECD-Rh sample and of an ECD-Rh sample, respectively.

These results demonstrate that the ELD-Rh survives annealing at 420° C. for 20 minutes without delaminating. Such an annealing is typical during back-end-of-line processing. Similar results were obtained for a 20 minutes annealing time at 500° C. and at 600° C.

Also demonstrated by these results is the fact that the deposited Rh is of excellent purity.

It is to be understood that although preferred embodiments, specific constructions and configurations, as well as materials, have been discussed herein for devices according to the present disclosure, various changes or modifications in form and detail may be made without departing from the scope of this disclosure. For example, any formulas given above are merely representative of procedures that may be used. Steps may be added or deleted to methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. An oxygen-free or oxygen-poor solution for the electroless deposition of a platinum group metal, comprising:
   a ruthenium (II) amine complex having an oxidation potential, and
   a platinum group metal compound having a reduction potential, larger than the opposite of the oxidation potential of the ruthenium (II) amine complex.

2. The solution according to claim 1 for depositing rhodium wherein the platinum group metal compound is a rhodium compound.

3. The solution according to claim 2, wherein the ruthenium amine complex is selected from $[Ru(NH_3)_6]^{2+}$ and $[Ru(en)_3]^{2+}$ wherein en stands for ethylenediamine.

4. The solution according to claim 3, wherein the platinum group metal compound has a general formula selected from $M^1X$, $M^2M^1X$, $M^1X \cdot xH_2O$ and $M^2M^1X \cdot xH_2O_2$, wherein x is an integer, wherein $M^1$ is one or more platinum group metal atoms totalizing a positive valency $v_1$, $M^2$ is one or more atoms, one or more functional groups, or a combination thereof, other than $M^1$, totalizing a positive valency $v_2$, and X is one or more atoms, one or more functional groups, or a combination thereof, totalizing a negative valency equal to $-(v_1+v_2)$.

5. The solution according to claim 1, further comprising a complexing agent.

6. The solution according to claim 1, wherein the molar ratio ruthenium (II) amine complex:platinum group metal compound is from 5:1 to 20:1.

7. A method for forming a platinum group metal interconnect during the fabrication of an integrated circuit, comprising the steps of:
 providing a substrate comprising:
  a semiconductor substrate,
  dielectric layer, the dielectric layer having a cavity therein for forming an interconnect, the cavity having a bottom, and
  a catalytic layer comprising a conductive material at least on the bottom of the cavity, and
 exposing the catalytic layer to an oxygen-free or oxygen poor solution comprising a Ru (II) amine complex having an oxidation potential, and a platinum group metal compound having a reduction potential larger than the opposite of the oxidation potential of the Ru (II) amine complex.

8. The method according to claim 7, wherein the solution comprises a Ru (II) amine complex.

9. The method according to claim 7, wherein exposing the catalytic layer to an oxygen-free or oxygen poor solution comprises:
 immersing the substrate having the catalytic layer in a solution comprising the platinum group metal compound, and
 gradually adding the Ru (II) amine complex from a solution.

10. The method according to claim 7, wherein the oxygen-free or oxygen-poor solution used in step b is obtained by a method comprising a step of generating electrochemically the Ru(II) amine complex by reduction from a Ru(III) amine complex.

11. The method according to any one of claim 7, wherein the cavity is a via, a trench, or a combination of both.

12. The method according to claim 7, wherein the platinum group metal interconnect is formed directly after the front-end of line of the fabrication of the integrated circuit.

13. The method according to claim 7, wherein the catalytic layer comprises a platinum group metal such as rhodium.

14. The method according to claim 7 wherein providing a substrate comprises:
 providing a semiconductor substrate,
 providing a dielectric layer above the semiconductor substrate, the dielectric layer comprising a cavity, and
 depositing a catalytic layer comprising a conductive material at least on the bottom of the cavity.

15. A method of electroless deposition of a platinum group metal, comprising the steps of:
 using a ruthenium (II) amine complex for the electroless deposition of a platinum group metal.

16. The method according to claim 15, wherein using a ruthenium (II) amine complex for the electroless deposition of a platinum group metal comprises using a ruthenium (II) amine complex for forming a platinum group metal interconnect during the fabrication of an integrated circuit.

17. The method according to claim 16, further comprising depositing the platinum group metal with a thickness of 1 to 40 nm.

18. The method according to claim 17, wherein the thickness is 5 to 10 nm.

19. The method according to claim 15, wherein the platinum group metal comprises:
 a ruthenium (II) amine complex having an oxidation potential.

20. The method according to claim 19, wherein the platinum group metal comprises:
 a platinum group metal compound having a reduction potential, larger than the opposite of the oxidation potential of the ruthenium (II) amine complex.

* * * * *